(12) United States Patent
Hosaka et al.

(10) Patent No.: US 12,106,997 B2
(45) Date of Patent: Oct. 1, 2024

(54) TEST DEVICE, CHANGE KIT, AND METHOD OF EXCHANGING CHANGE KIT

(71) Applicant: TOKYO ELECTRON LIMITED, Tokyo (JP)

(72) Inventors: Hiroki Hosaka, Yamanashi (JP); Hiroshi Amemiya, Yamanashi (JP); Fumito Kagami, Yamanashi (JP); Tadashi Obikane, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 505 days.

(21) Appl. No.: 17/526,862

(22) Filed: Nov. 15, 2021

(65) Prior Publication Data

US 2022/0172978 A1 Jun. 2, 2022

(30) Foreign Application Priority Data

Nov. 27, 2020 (JP) ................................. 2020-197194

(51) Int. Cl.
| | |
|---|---|
| *H01L 21/68* | (2006.01) |
| *G01R 31/28* | (2006.01) |
| *H01L 21/67* | (2006.01) |
| *H01L 21/683* | (2006.01) |

(52) U.S. Cl.
CPC ...... *H01L 21/6838* (2013.01); *G01R 31/2865* (2013.01); *G01R 31/2893* (2013.01); *H01L 21/67259* (2013.01); *H01L 21/681* (2013.01)

(58) Field of Classification Search
CPC .......... H01L 21/6838; H01L 21/67259; H01L 21/681; H01L 21/67294; H01L 21/68707; H01L 21/68785; G01R 31/2865; G01R 31/2893; G01R 31/2887
See application file for complete search history.

(56) References Cited

U.S. PATENT DOCUMENTS

| | | | |
|---|---|---|---|
| 6,168,668 B1* | 1/2001 | Yudovsky | H01L 21/68 118/728 |
| 2008/0174330 A1* | 7/2008 | Parrish | G01R 1/0491 257/786 |
| 2016/0237565 A1* | 8/2016 | Sieber | C23C 16/45508 |
| 2019/0079413 A1* | 3/2019 | Mathijssen | G03F 7/70625 |
| 2020/0071090 A1 | 3/2020 | Takata et al. | |

FOREIGN PATENT DOCUMENTS

| | | |
|---|---|---|
| JP | 2016-197707 A | 11/2016 |
| JP | 2020-145323 A | 9/2020 |

* cited by examiner

*Primary Examiner* — Alvaro E Fortich
(74) *Attorney, Agent, or Firm* — Fenwick & West LLP (57) ABSTRACT

Techniques for testing both a rectangular substrate and a circular substrate are provided. One aspect of the present disclosure pertains to a test device comprising an exchangeable change kit, wherein the change kit comprises a first holding device and a second holding device which are exchangeably mounted in the test device, wherein the first holding device is configured to adsorb and hold a rectangular substrate, wherein the second holding device is configured to adsorb and hold a circular substrate, and wherein the first holding device and the second holding device are exchanged according to a substrate to be tested.

8 Claims, 11 Drawing Sheets

TEST DEVICE, CHANGE KIT, AND METHOD OF EXCHANGING CHANGE KIT

CROSS-REFERENCE TO RELATED APPLICATIONS

This application claims priority to Japanese Patent Application No. 2020-197194 filed on Nov. 27, 2020, the entire contents of which are incorporated herein by reference.

TECHNICAL FIELD

The present disclosure relates to a test device, a change kit, and a method of exchanging a change kit.

BACKGROUND

There is known a stage including a substrate holding surface configured to adsorb and hold a low surface of a substrate and an adsorption groove divided into a plurality of regions for allowing a substrate to be adsorbed to and held by the substrate holding surface (for example, refer to Japanese Laid-open Patent Publication No. 2016-197707). In Japanese Laid-open Patent Publication No. 2016-197707, the entirety of the substrate is adsorbed onto and held by the stage by repetitively adsorbing, by at least one region of the plurality of regions, a part of the substrate and then adsorbing, by a region adjacent to the region, another part of the substrate.

SUMMARY

The present disclosure is directed to providing a technology for testing both a rectangular substrate and a circular substrate.

One aspect of the present disclosure pertains to a test device comprising an exchangeable change kit, wherein the change kit comprises a first holding device and a second holding device which are exchangeably mounted in the test device, wherein the first holding device is configured to adsorb and hold a rectangular substrate, wherein the second holding device is configured to adsorb and hold a circular substrate, and wherein the first holding device and the second holding device are exchanged according to a substrate to be tested.

DETAILED DESCRIPTION

Hereinafter, non-limiting exemplary embodiments of the present disclosure will be described with reference to the accompanying drawings. Throughout the accompanying drawings, the same or corresponding members or components are assigned with the same or corresponding reference numeral and redundant description therefor will be omitted.

[Test Apparatus]

Figure 1:
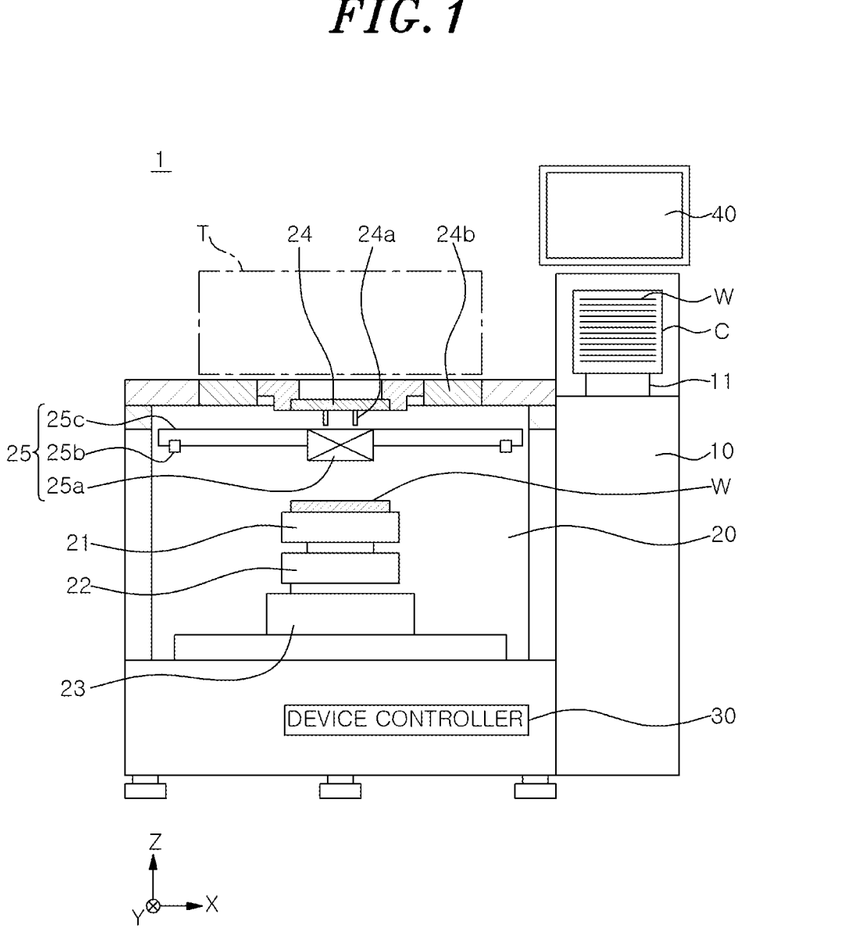
FIG. 1 is a diagram illustrating an example of a test device according to an embodiment.
Figure 2:
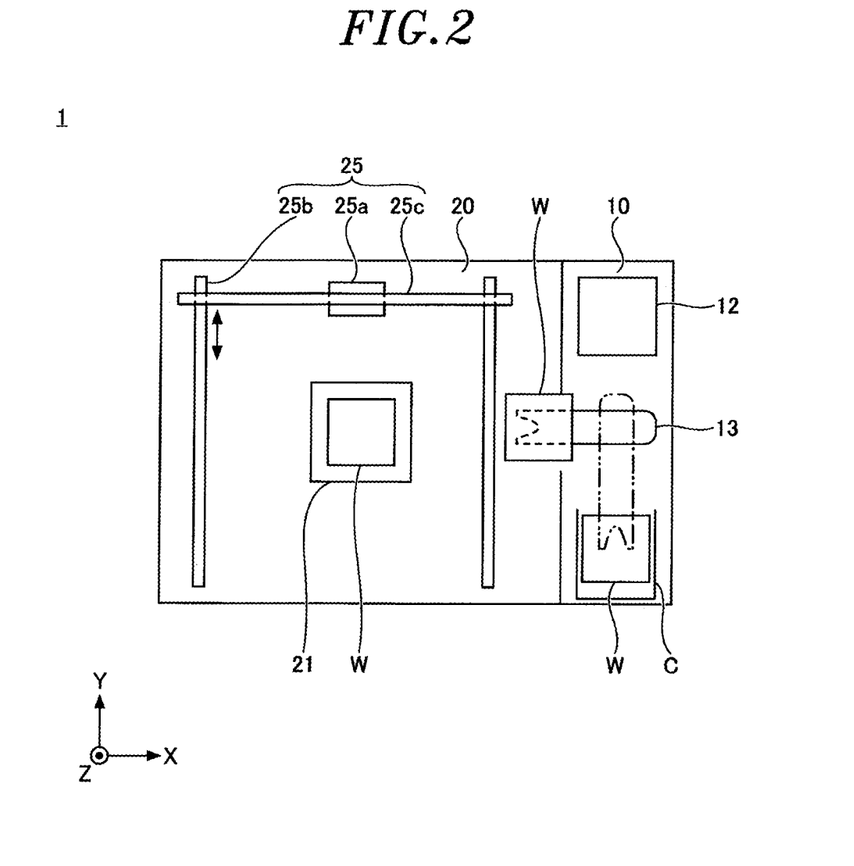
FIG. 2 is a plan view of the test device of FIG. 1.

An example of a test device according to an embodiment will be described with reference to FIGS. 1 and 2.

A test device 1 is a device capable testing a substrate W that is either one of a rectangular substrate and a circular substrate. The test device 1 includes a loader 10, a tester 20, and a device controller 30. Under the control of the device controller 30, the test device 1 transfers a substrate W to be tested from the loader 10 to the tester 20 and applies an electrical signal to a device under test (DUT) formed on the substrate W so as to test various electrical characteristics. The substrate W may be, for example, a rectangular substrate or a circular substrate. Examples of the rectangular substrate include a panel level package (PLP). Examples of the circular substrate include a semiconductor wafer.

The loader 10 includes a load port 11, an aligner 12, and a substrate transfer device 13. The load port 11 is loaded with a cassette C which accommodates the substrate W. The aligner 12 performs position alignment of the substrate W. The substrate transfer device 13 transfers the substrate W among the cassette C loaded in the load port 11, the aligner 12, and a mounting table 21 which will be described below. In the loader 10, the substrate transfer device 13 transfers the substrate W accommodated in the cassette C to the aligner 12. Subsequently, the aligner 12 performs position alignment of the substrate W. Then, the substrate transfer device 13 transfers the aligned substrate W from the aligner 12 to the mounting table 21 provided in the tester 20.

The tester 20 is disposed adjacent to the loader 10. The tester 20 includes the mounting table 21, a lifting mechanism 22, an XY-stage 23, a probe card 24, and an alignment device 25.

The mounting table 21 has a mounting surface. The substrate W is mounted on the mounting surface of the mounting table 21. The mounting table 21 includes, for example, a vacuum chuck.

The lifting mechanism 22 is provided below the mounting table 21 and lifts the mounting table 21 with respect to the XY-stage 23. The lifting mechanism 22 includes, for example, a stepping motor.

The XY-stage 23 is provided below the lifting mechanism 22 and moves the mounting table 21 and the lifting mechanism 22 in biaxial directions (an X direction and a Y direction in the drawings). The XY-stage 23 is fixed to a bottom portion of the tester 20. The XY-stage 23 includes, for example, a stepping motor.

The probe card 24 is disposed above the mounting table 21. A plurality of probes 24a are formed at a side of the probe card 24 facing the mounting table 21. The probe card 24 is detachably mounted on a head plate 24b. A tester (not shown) is connected to the probe card 24 via a test head T.

The alignment device 25 includes a camera 25a, a guide rail 25b, and an alignment bridge 25c. The camera 25a is mounted downwardly at a center of the alignment bridge 25c and takes images of the mounting table 21, the substrate W, and the like. The camera 25a is, for example, a charge-coupled device (CCD) camera or a complementary metal-oxide semiconductor (CMOS) camera. The guide rail 25b supports the alignment bridge 25c to be movable in a horizontal direction (the Y direction in the drawings). The alignment bridge 25c is supported by a pair of left and right guide rails 25b and moves in the horizontal direction (Y direction in the drawings) along the guide rails 25b. Accordingly, the camera 25a moves between a standby position and a position directly below the center of the probe card 24 (hereinafter, referred to as a "probe center"), via the alignment bridge 25c. During alignment, while the mounting table 21 moves in an XY direction, the camera 25a located at the probe center captures an image of an electrode pad of the substrate W on the mounting table 21 from above, and the captured image is processed and displayed on a display device 40.

In the tester 20, the alignment device 25 performs position alignment between an electrode pad of the DUT formed on the substrate W on the mounting table 21 and the plurality of probes 24a of the probe card 24. Subsequently, the lifting mechanism 22 lifts the mounting table 21 and allows the plurality of probes 24a of the probe card 24 to contact with the corresponding electrode pads. Subsequently, the device controller 30 applies a test signal from the tester to the DUT formed on the substrate W via the test head T and the plurality of probes 24a of the probe card 24 so as to test electrical characteristics of the DUT.

The device controller 30 is provided below the mounting table 21 and controls the overall operation of the test device 1. A central processing unit (CPU) provided in the device controller 30 may perform a desired test according to a type parameter stored in a memory such as a read-only memory (ROM), random-access memory (RAM), and the like. Also, the type parameter may be stored in a hard disk or a semiconductor memory other than the ROM and RAM. Also, the type parameter may be recorded in a recording medium such as a computer-readable compact disc (CD)-ROM, a digital versatile disc (DVD), and the like.

[Change Kit]

An example of a change kit exchangeably mounted in the test device 1 according to an embodiment will be described. The change kit includes a rectangular substrate holding device and a pick for a rectangular substrate, which are used for testing a rectangular substrate, and a circular substrate holding device and a pick for a circular substrate, which are used for testing a circular substrate. In the test device 1 according to the embodiment, when a rectangular substrate is tested, a rectangular substrate holding device is mounted as the mounting table 21 and a pick for a rectangular substrate is mounted as a pick of the substrate transfer device 13. Also, in the test device 1 according to the embodiment, when a circular substrate is tested, a circular substrate holding device is mounted as the mounting table 21 and a pick for a circular substrate is mounted as a pick of the substrate transfer device 13. Hereinafter, examples of the rectangular substrate holding device, the circular substrate holding device, the pick for a rectangular substrate, and the pick for a circular substrate will be described.

(Rectangular Substrate Holding Device)

Figure 3:
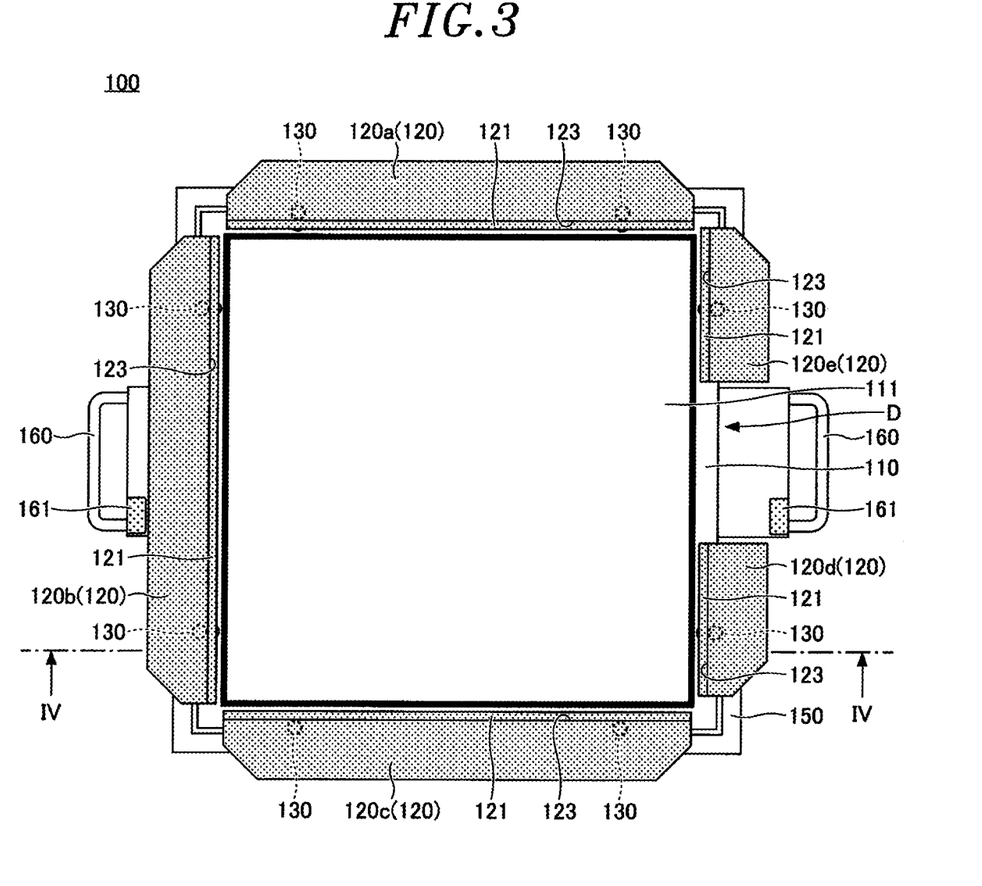
FIG. 3 is a schematic plan view illustrating an example of a rectangular substrate holding device.
Figure 4:
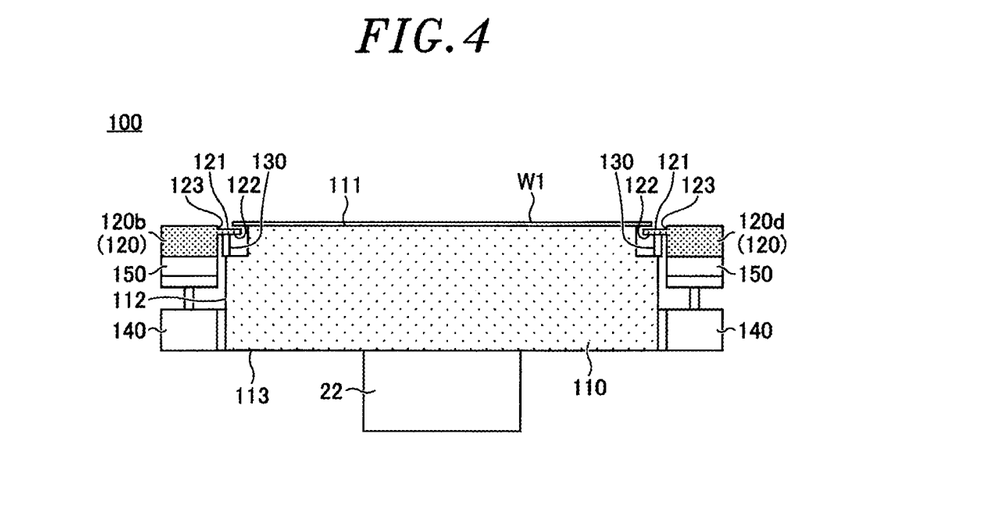
FIG. 4 is a schematic cross-sectional view illustrating an example of the rectangular substrate holding device.

An example of the rectangular substrate holding device according to an embodiment will be described with reference to FIGS. 3 to 8. FIG. 3 is a schematic plan view illustrating an example of a rectangular substrate holding device according to the embodiment. FIG. 4 is a schematic cross-sectional view illustrating an example of a rectangular substrate holding device according to the embodiment and shows a cross section taken along the dash-dotted line Iv-Iv in FIG. 3. Also, FIG. 3 illustrates a state in which the rectangular substrate holding device does not hold a substrate and FIG. 4 illustrates a state in which the rectangular substrate holding device holds the substrate.

A rectangular substrate holding device 100 is configured to hold a rectangular substrate W1. The rectangular substrate holding device 100 includes a mounting table 110, a plurality of holding portions 120, a protruding portion 130, a lifting mechanism 140, a horizontal movement device 150, a handle 160, a shaft 170, and a connector 180.

The mounting table 110 has a rectangular mounting surface 111. In the mounting table 110, the rectangular substrate W1 is mounted on the mounting surface 111. The mounting table 110 includes, for example, a vacuum chuck. The mounting table 110 is lifted by the lifting mechanism 22 connected therebelow.

The plurality of holding portions 120 are provided to correspond to the four sides of the mounting surface 111. The plurality of holding portions 120 may include holding portions 120a to 120e. The holding portions 120a and 120c are provided to correspond to one of two pairs of facing sides of the mounting surface 111. The holding portion 120a and the holding portion 120c are disposed to face each other with the mounting surface 111 interposed therebetween. The holding portions 120b, 120d, and 120e are provided to correspond to the other of the two pairs of facing sides of the mounting surface 111. The holding portion 120b and the holding portions 120d and 120e are disposed to face each other with the mounting surface 111 interposed therebetween. The holding portions 120a to 120e each have an approximately rectangular shape having a longitudinal direction parallel to a side of the mounting surface 111. The holding portions 120a to 120c each have a longitudinal length approximately equal to a one side of the mounting surface 111. The holding portions 120d and 120e each have a longitudinal length which is one third of the first side of the mounting surface 111. The holding portion 120d is provided on one end of the one side of the mounting surface 111, and the holding portion 120e is provided on the other end of the one side of the mounting surface 111. Accordingly, a gap D is formed between the holding portion 120d and the holding portion 120e and thus a transfer arm (not shown) is inserted into an upper side of the mounting table 110 through the gap D. Each of the holding portions 120a to 120e includes an upper surface 121, a lower surface 122, and a wall portion 123. The upper surface 121 holds a lower surface of a peripheral portion of the substrate W. The lower surface 122 presses down on an upper surface of the peripheral portion of the substrate W mounted on the mounting surface 110. The wall portion 123 extends upward from the upper surface 121 and is configured to contact with an end surface of the substrate W supported by the upper surface 121.

The protruding portion 130 protrudes from a lower surface of each of the holding portions 120a to 120e and contacts with the end surface of the substrate W loaded on the mounting table 110 so as to correct a position of the substrate W. The protruding portion 130 has, for example, a rod shape. Two protruding portions 130 are provided symmetrically with respect to a center in the longitudinal direction of each of the holding portions 120a to 120c. Also, the protruding portion 130 is provided at an approximate center in the longitudinal direction of each of the holding portions 120d and 120e. However, the number of the protruding portions 130 is merely an example and is not limited thereto. Also, the protruding portion 130 may have, for example, a plate shape extending along the longitudinal direction of each of the holding portions 120a to 120e.

The lifting mechanism 140 is fixed to an outer peripheral wall of the mounting table 110. The lifting mechanism 140 lifts the plurality of holding portions 120 with respect to the mounting table 110. The lifting mechanism 140 may be, for example, a cylinder including a guide.

The horizontal movement device 150 is liftably mounted on the lifting mechanism 140. The horizontal movement device 150 horizontally moves the plurality of holding portions 120 between a closed position and an open position. The closed position is a position for holding the lower surface of the peripheral portion of the substrate W or for pressing down on the upper surface of the peripheral portion of the substrate W, and, that is, a position where the plurality of holding portions 120 are close to the mounting table 110. The open position is a position spaced outward apart from the mounting table 110 compared to the closed position. The horizontal movement device 150 may be, for example, a rotary actuator.

Figure 5:
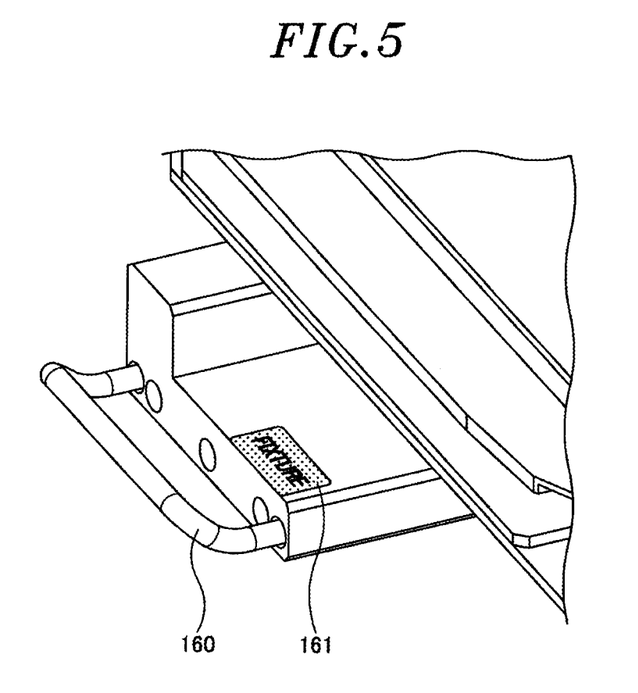
FIG. 5 is a diagram illustrating an example of a handle of the rectangular substrate holding device.

The handle 160 is detachably mounted on each of two facing sidewalls 112 of the mounting table 110 using a fastening member such as a screw or the like. Since a worker is able to mount or demount the rectangular substrate holding device 100 while holding the handle 160, workability is improved. The handle 160 is separated from the test device 1, for example, when the rectangular substrate W1 is tested. Accordingly, to prevent forgetting to separate the handles 160 from the rectangular substrate holding device 100, an identification portion 161 may be provided at positions easily recognizable by the worker with the naked eye.

The identification portion 161 may be provided at positions that can be easily recognized by the worker with the naked eye, for example, upper surfaces of the handles 160. The identification portion 161 may be, for example, a marker having different color from the rectangular substrate holding device 100 or text indicating that it is a jig. In an example of FIG. 5, the identification portion 161 includes a yellow label attached to the upper surface of the handle 160 and black text "FIXTURE" attached on the label.

Figure 6A:
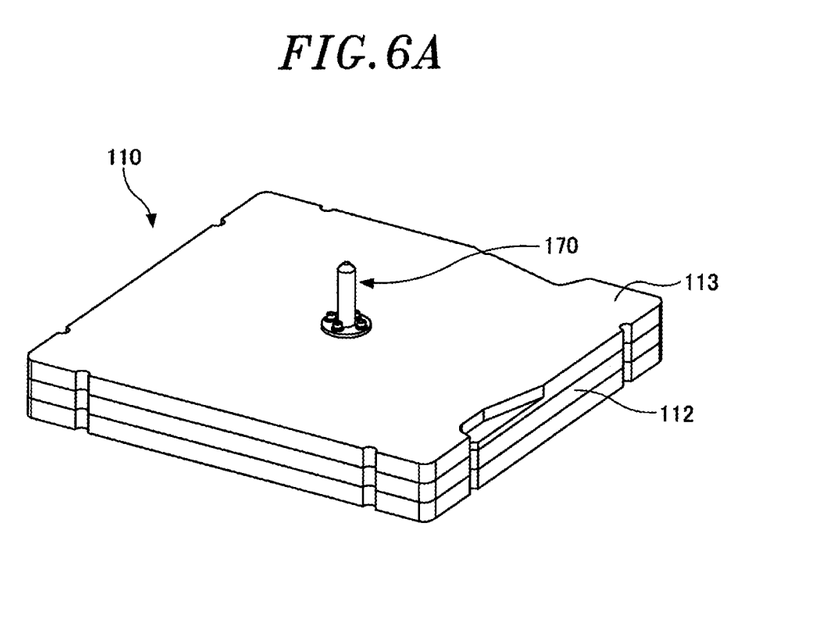
FIGS. 6A and 6B are diagrams illustrating an example of a shaft of the rectangular substrate holding device.
Figure 6B:
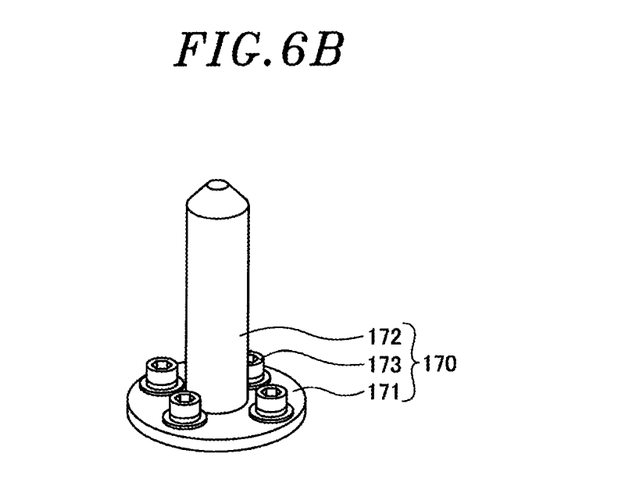

The shaft 170 is mounted in the middle of a lower surface 113 of the mounting table 110. The shaft 170 includes a stand 171 and an insertion pin 172.

Figure 7A:
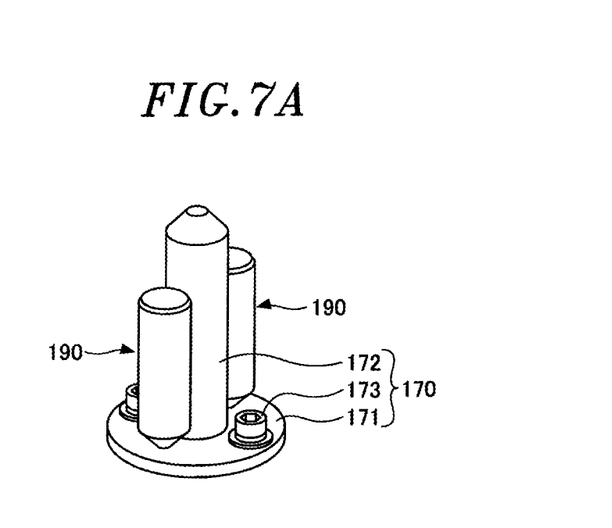
FIGS. 7A and 7B are diagrams for explaining the determination of a position of the shaft.
Figure 7B:
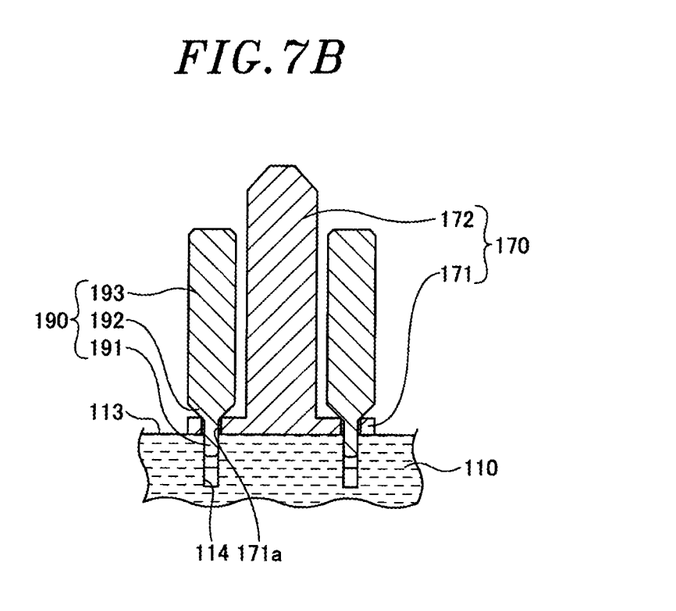

On the stand 171, a plurality of (for example, four) insertion holes 171a through which a shaft portion of a screw 173 is insertable are formed (see FIG. 7B). Each of the insertion holes 171a has an inner diameter slightly larger than the shaft portion of the screw 173. The stand 171 is fixed to the lower surface 113 of the mounting table 110 by the screws 173 inserted into the insertion holes 171a.

The insertion pin 172 has an approximate rod shape formed to be insertable into an insertion hole (not shown) formed in an upper surface of the lifting mechanism 22. The insertion pin 172 is inserted into the insertion hole and an adsorption device (not shown) is turned on so that the rectangular substrate holding device 100 is adsorbed onto the lifting mechanism 22.

When the shaft 170 is mounted on the lower surface 113 of the mounting table 110, for example, as shown in FIGS. 7A and 7B, a center-setting jig 190 may be used. The center-setting jig 190 includes a small-diameter portion 191, a tapered portion 192, and a large-diameter portion 193. The small-diameter portion 191 has an outer diameter smaller than the insertion hole 171a formed in the stand 171 and approximately equal to a screw hole 114 formed in the lower surface 113 of the mounting table 110. The tapered portion 192 is a part between the small-diameter portion 191 and the large-diameter portion 193 and has an outer diameter increasingly extending from the outer diameter of the small-diameter portion 191 to an outer diameter of the large-diameter portion 193. The large-diameter portion 193 has an outer diameter greater than the insertion hole 171a of the stand 171. When the shaft 170 is mounted on the lower surface 113 of the mounting table 110, the small-diameter portion 191 of the center-setting jig 190 is inserted into each of the two facing insertion holes 171a with the insertion pin 172 interposed therebetween, and the center-setting jig 190 is twisted and inserted therein until the tapered portion 192 does not move. Also, while the center-setting jig 190 is twisted and inserted therein, the screws 173 are inserted into the two insertion holes 171a, into which the center-setting jig 190 is not inserted, and are fastened to the screw holes 114 formed in the lower surface 113 of the mounting table 110. Subsequently, the center-setting jig 190 is separated, and the screws 173 are inserted into the two insertion holes 171a, from which the center-setting jig 190 is separated, and are fastened to the screw holes 114 formed in the lower surface 113 of the mounting table 110. Accordingly, the shaft 170 is mounted, with high precision, in the middle of the lower surface 113 of the mounting table 110. Consequently, when the circular substrate holding device 200 is replaced by the rectangular substrate holding device 100, misalignment of the central position of the rectangular substrate holding device 100 may be prevented.

Figure 8:
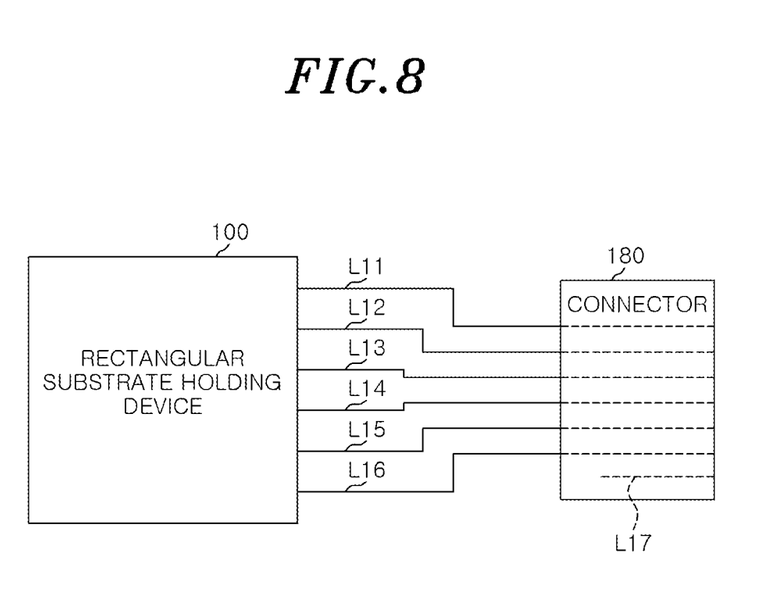
FIG. 8 is a block diagram illustrating an example of a connector of the rectangular substrate holding device.

The connector 180 includes various tubes, cables, and the like used in the rectangular substrate holding device 100 (see FIG. 8). When the circular substrate holding device 200 is replaced by the rectangular substrate holding device 100, various tubes, cables, and the like are mutually connected by connecting the connector 180 of the rectangular substrate holding device 100 to a connector (not shown) of the test device 1. The connector 180 includes, for example, a vacuum tube L11, an air tube L12, a signal cable L13, a fiber cable L14, a heater cable L15, and a temperature sensor cable L16. Also, the connector 180 may include a recognition terminal L17 configured to allow the device controller 30 to recognize that the rectangular substrate holding device 100 is mounted on the test device 1. Also, the connector 180 does not need to be integrated into a single one and may be configured to be collected per function.

(Circular Substrate Holding Device)

Figure 9:
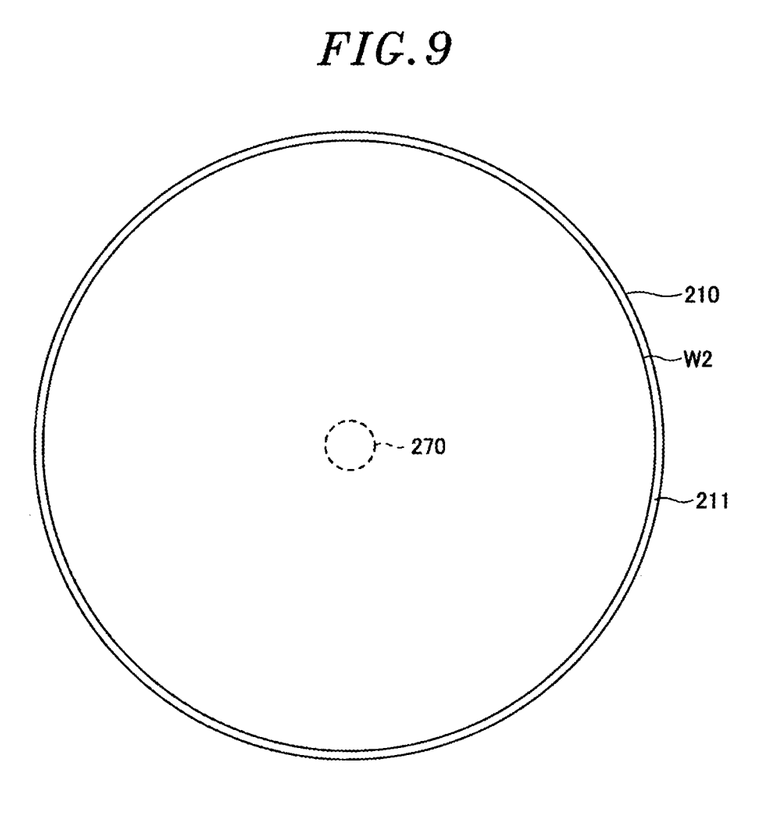
FIG. 9 is a schematic plan view illustrating an example of a circular substrate holding device.

An example of the circular substrate holding device according to an embodiment will be described with reference to FIGS. 9 and 10. FIG. 9 is a schematic plan view illustrating an example of a circular substrate holding device according to an embodiment.

A circular substrate holding device 200 is configured to hold a circular substrate W2. The circular substrate holding device 200 includes a mounting table 210, a shaft 270, and a connector 280.

The mounting table 210 has a circular mounting surface 211. In the mounting table 210, the circular substrate W2 is mounted on the mounting surface 211. The mounting table 210 includes, for example, a vacuum chuck. The mounting table 210 is lifted by the lifting mechanism 22 connected therebelow.

The shaft 270 is mounted in the middle of a lower surface of the mounting table 210. The shaft 270 may be the same component as the shaft 170 of the rectangular substrate holding device 100.

Figure 10:
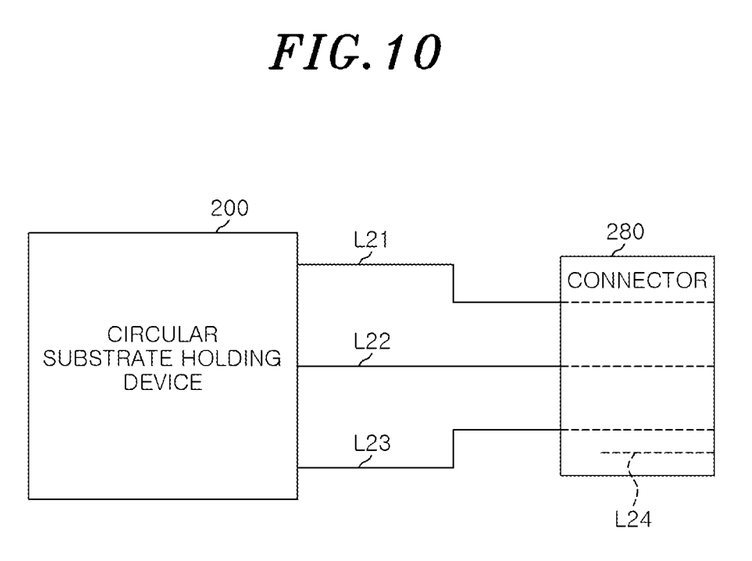
FIG. 10 is a block diagram illustrating an example of a connector of the circular substrate holding device.

The connector 280 includes various tubes, cables, and the like used in the circular substrate holding device 200 (see FIG. 10). When the rectangular substrate holding device 100 is replaced by the circular substrate holding device 200, various tubes, cables, and the like are mutually connected by connecting the connector 280 of the circular substrate holding device 200 to the connector (not shown) of the test device 1. The connector 280 includes, for example, a vacuum tube L21, a heater cable L22, and a temperature sensor cable L23. Also, the connector 280 may include a recognition terminal L24 configured to allow the device controller 30 to recognize that the circular substrate holding device 200 is mounted on the test device 1.

(Pick for Rectangular Substrate)

Figure 11:
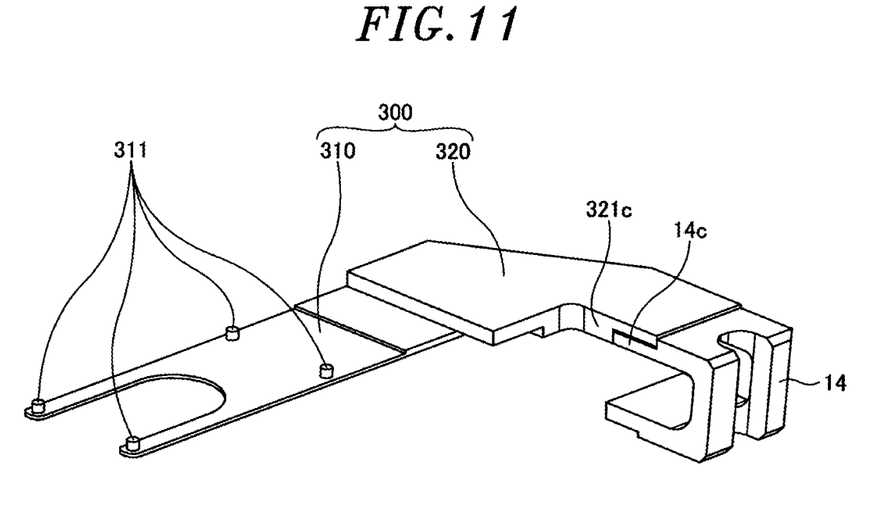
FIG. 11 is a diagram illustrating an example of a transfer device on which a pick for a rectangular substrate is mounted.
Figure 12:
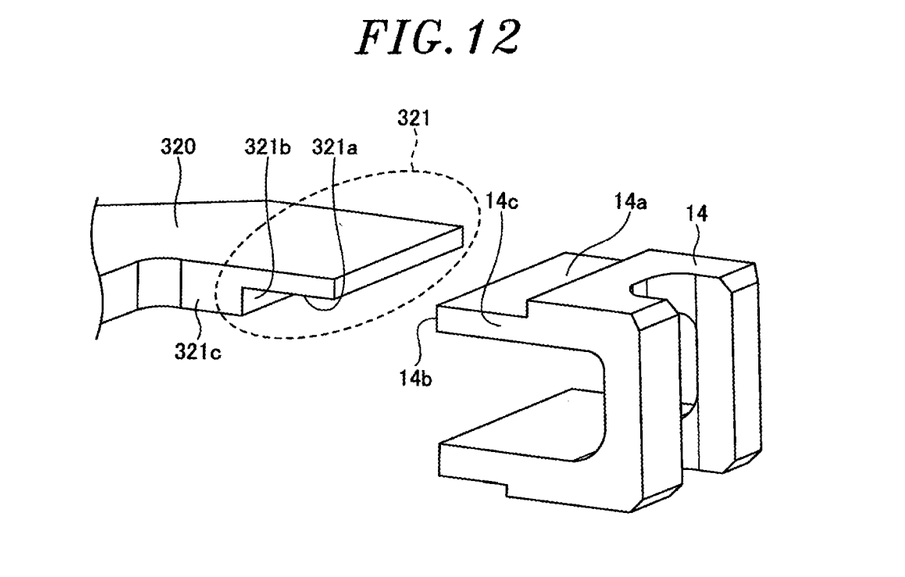
FIG. 12 is a diagram illustrating an example of the transfer device before the pick for a rectangular substrate is mounted thereon.

An example of a pick for a rectangular substrate will be described with reference to FIGS. 11 and 12. FIG. 11 is a diagram illustrating an example of a transfer device on which the pick for a rectangular substrate is mounted. FIG. 12 is a diagram illustrating an example of the transfer device before the pick for a rectangular substrate is mounted thereon.

The pick 300 for a rectangular substrate is configured to send or receive the rectangular substrate W1 to or from the rectangular substrate holding device 100. The pick 300 for a rectangular substrate includes a fore-end portion 310 and a base end portion 320.

The fore-end portion 310 has an approximate U-shape. A plurality of (for example, four) vacuum adsorption pads 311 are provided on an upper surface of the fore-end portion 310. The vacuum adsorption pads 311 vacuum-adsorb and hold the rectangular substrate W1.

The base end portion 320 is detachably mounted on an arm 14 of the substrate transfer apparatus 13. The base end portion 320 includes a position-setting part 321. When the pick 300 for a rectangular substrate is mounted on the arm 14, adjustment for replacing the pick 400 for a circular substrate by the pick 300 for a rectangular substrate may be simplified when the position-setting part 321 of the base end portion 320 is mounted on the arm 14 as a reference.

In an example of FIGS. 11 and 12, the arm 14 includes a seating surface 14a, a first position determining surface 14b, and a second position determining surface 14c. The position-setting part 321 of the base end portion 320 includes a mounting surface 321a, a pressurizing surface 321b, and a position determining surface 321c. When the pick 300 for a rectangular substrate is mounted on the arm 14, the mounting surface 321a is mounted on the seating surface 14a, the pressurizing surface 321b is pressed against the first position determining surface 14b, and at the same time the position determining surface 321c comes into surface contact with the second position determining surface 14c.

Also, although one fore-end portion 310 is shown as being mounted on the base end portion 320 in the example of FIG. 11, the present disclosure is not limited thereto. For example, two or more fore-end portions 310 may be mounted, in multiple stages, on the base end portion 320. Accordingly, a plurality of rectangular substrates W1 may be transferred at the same time.

(Pick for Circular Substrate)

Figure 13:
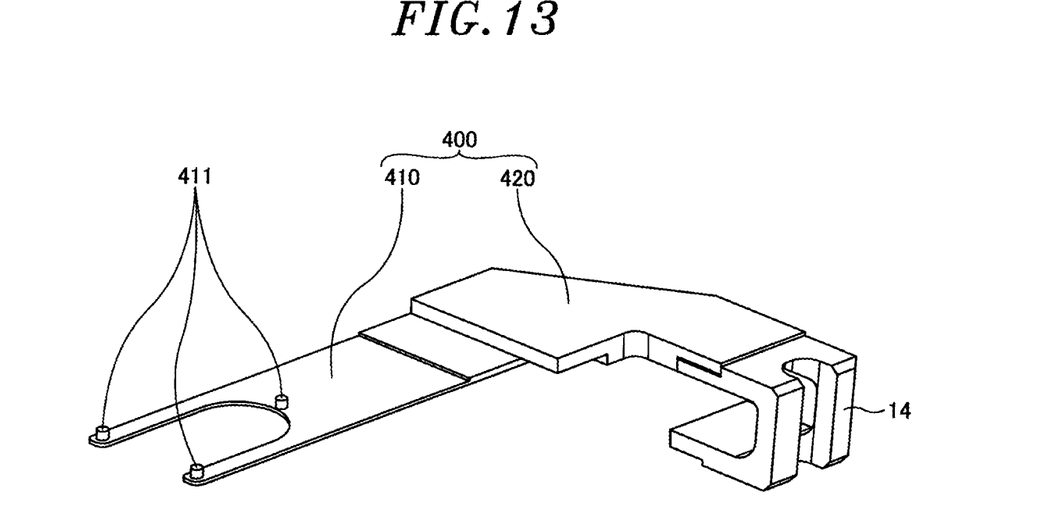
FIG. 13 is a diagram illustrating an example of the transfer device on which a pick for a circular substrate is mounted.

An example of the pick for a circular substrate will be described with reference to FIG. 13. FIG. 13 is a diagram illustrating an example of the transfer device on which the pick for a circular substrate is mounted.

The pick 400 for a circular substrate is configured to send or receive the circular substrate W2 to or from the circular substrate holding device 200. The pick 400 for a circular substrate includes a fore-end portion 410 and a base end portion 420.

The fore-end portion 410 has an approximate U-shape. A plurality of (for example, three) vacuum adsorption pads 411 are provided on an upper surface of the fore-end portion 410. The vacuum adsorption pads 411 vacuum-adsorb and hold the circular substrate W2.

The base end portion 420 may be the same component as the base end portion 320 of the pick 300 for a rectangular substrate.

Also, although one fore-end portion 410 is shown as being mounted on the base end portion 420 in the example of FIG. 13, the present disclosure is not limited thereto. For example, two or more fore-end portions 410 may be mounted, in multiple stages, on the base end portion 420. Accordingly, a plurality of circular substrates W2 may be transferred at the same time.

In the above embodiments, the rectangular substrate holding device 100 is an example of a first holding device, the mounting table 110 is an example of a first adsorption-holding device, and the shaft 170 is an example of a first insertion pin. Also, the circular substrate holding device 200 is an example of a second holding device, the mounting table 210 is an example of a second adsorption-holding device, and the shaft 270 is an example of a second insertion pin. Also, the pick 300 for a rectangular substrate is an example of a first transfer device, and the pick 400 for a circular substrate is an example of a second transfer device.

It should be noted that the embodiments disclosed herein are exemplary in every aspect and are not limitative. The above embodiments may be omitted, substituted, and changed into various forms without departing from the attached claims and the purpose thereof.

What is claimed is:

1. A test device comprising an exchangeable change kit,
    wherein the change kit comprises a first holding device and a second holding device which are exchangeably mounted in the test device,
    wherein the first holding device is configured to adsorb and hold a rectangular substrate,
    wherein the second holding device is configured to adsorb and hold a circular substrate, and
    wherein the first holding device and the second holding device are exchanged according to a substrate to be tested.

2. The test device of claim 1, wherein insertion holes configured to mount the first holding device and the second holding device are provided in the test device,
    wherein the first holding device comprises:
    a first adsorption-holding device configured to adsorb and hold the rectangular substrate on an upper surface; and
    a first insertion pin extending downward from a center of a lower surface of the first adsorption-holding device and insertable into the insertion hole, and
    wherein the second holding device comprises:
    a second adsorption-holding device configured to adsorb and hold the circular substrate on an upper surface; and
    a second insertion pin extending downward from a center of a lower surface of the second adsorption-holding device and insertable into the insertion hole.

3. The test device of claim 2, wherein the first holding device comprises a downward pressing device configured to press down on an end of the rectangular substrate held by the first adsorption-holding device toward the first adsorption-holding device.

4. The test device of claim 1, wherein the change kit further comprises a first transfer device and a second transfer device which are exchangeably mounted in the test device,
   wherein the first transfer device is configured to send or receive the rectangular substrate to or from the first holding device,
   wherein the second transfer device is configured to send or receive the circular substrate to or from the second holding device, and
   wherein the first transfer device and the second transfer device are exchanged according to a substrate to be tested.

5. The test device of claim 2, wherein the change kit further comprises a first transfer device and a second transfer device which are exchangeably mounted in the test device,
   wherein the first transfer device is configured to send or receive the rectangular substrate to or from the first holding device,
   wherein the second transfer device is configured to send or receive the circular substrate to or from the second holding device, and
   wherein the first transfer device and the second transfer device are exchanged according to a substrate to be tested.

6. The test device of claim 3, wherein the change kit further comprises a first transfer device and a second transfer device which are exchangeably mounted in the test device,
   wherein the first transfer device is configured to send or receive the rectangular substrate to or from the first holding device,
   wherein the second transfer device is configured to send or receive the circular substrate to or from the second holding device, and
   wherein the first transfer device and the second transfer device are exchanged according to a substrate to be tested.

7. A change kit exchangeably mounted in a test device, comprising a first holding device and a second holding device which are exchangeably mounted in the test device,
   wherein the first holding device is configured to adsorb and hold a rectangular substrate,
   wherein the second holding device is configured to adsorb and hold a circular substrate, and
   wherein the first holding device and the second holding device are exchanged according to a substrate to be tested.

8. A method of exchanging a change kit exchangeably mounted in a test device,
   wherein the change kit comprises a first holding device and a second holding device which are exchangeably mounted in the test device,
   wherein the first holding device is configured to adsorb and hold a rectangular substrate,
   wherein the second holding device is configured to adsorb and hold a circular substrate, and
   wherein the first holding device and the second holding device are exchanged according to a substrate to be tested.

* * * * *